(12) United States Patent
Kim et al.

(10) Patent No.: US 10,935,574 B2
(45) Date of Patent: Mar. 2, 2021

(54) PROBE CARD ASSEMBLY (71) Applicant: Samsung Electronics Co., Ltd., Suwon-si (KR)

(72) Inventors: Gyu Yeol Kim, Hwaseong-si (KR); Yu Kyum Kim, Hwaseong-si (KR); Jae Won Kim, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 429 days.

(21) Appl. No.: 15/832,762

(22) Filed: Dec. 5, 2017

(65) Prior Publication Data

US 2018/0224481 A1 Aug. 9, 2018

(30) Foreign Application Priority Data

Feb. 8, 2017 (KR) .......................... 10-2017-0017282

(51) Int. Cl.
G01R 1/073 (2006.01)
G01R 31/28 (2006.01)
H01L 21/00 (2006.01)

(52) U.S. Cl.
CPC ..... G01R 1/07371 (2013.01); G01R 1/07342 (2013.01); G01R 1/07378 (2013.01); G01R 31/2891 (2013.01)

(58) Field of Classification Search
CPC ....... G01R 1/00; H01L 21/00; H01L 2221/00; H05K 1/00; H05K 2201/00
See application file for complete search history.

(56) References Cited

U.S. PATENT DOCUMENTS

| 6,784,678 | B2 | 8/2004 | Pietzschmann | |
|---|---|---|---|---|
| 7,285,968 | B2 | 10/2007 | Eldridge et al. | |
| 7,977,957 | B2 | 7/2011 | Böhm | |
| 8,836,363 | B2 | 9/2014 | Goel et al. | |
| 9,188,607 | B2 | 11/2015 | Hwang et al. | |
| 2005/0108875 | A1* | 5/2005 | Mathieu | G01R 1/06711 29/852 |
| 2006/0290343 | A1* | 12/2006 | Crafts | G01R 1/07357 324/754.18 |
| 2008/0105355 | A1* | 5/2008 | Kumar | G01R 3/00 156/60 |
| 2009/0237099 | A1* | 9/2009 | Garabedian | G01R 3/00 324/756.03 |
| 2012/0068725 | A1* | 3/2012 | Pagani | G01R 1/06794 324/750.16 |
| 2015/0168455 | A1* | 6/2015 | Anraku | C22C 5/04 324/754.03 |

(Continued)

FOREIGN PATENT DOCUMENTS

JP 2001330626 A 11/2001
JP 2010169651 A 8/2010

(Continued)

*Primary Examiner* — Jermele M Hollington
*Assistant Examiner* — Temilade S Rhodes-Vivour
(74) *Attorney, Agent, or Firm* — Renaissance IP Law Group LLP (57) ABSTRACT A probe card assembly is provided as follows. A tile fixing substrate is disposed on a printed circuit board. A plurality of ceramic tiles is detachably attached to the tile fixing substrate. Each of the plurality of ceramic tiles comprises a plurality of probes. A plurality of alignment marks is fixed to the tile fixing substrate.

17 Claims, 8 Drawing Sheets (56) References Cited

U.S. PATENT DOCUMENTS

2016/0161548 A1* 6/2016 Mikkola ............ G01R 31/2818
324/750.01
2017/0315149 A1* 11/2017 Chen .................. G01R 1/07307

FOREIGN PATENT DOCUMENTS

KR 20090107121 A 10/2009
KR 20130062720 A 6/2013

* cited by examiner

PROBE CARD ASSEMBLY

This application claims priority under 35 U.S.C. § 119 to Korean Patent Application No. 10-2017-0017282 filed on Feb. 8, 2017 in the Korean Intellectual Property Office, the disclosure of which is incorporated by reference herein in its entirety.

TECHNICAL FIELD

The present inventive concept relates to a probe card assembly.

DESCRIPTION OF RELATED ART

Semiconductor devices are manufactured by a FAB (fabrication) process for forming a pattern on a wafer, and an assembly process for assembling the wafer, on which the pattern is formed, with each unit chip. Between the FAB process and the assembly process, an EDS (Electric Die Sorting) process for testing the electrical characteristics of unit semiconductor devices constituting the wafer is performed.

The EDS process is performed to sort out defective devices among the semiconductor devices. The EDS process utilizes a test apparatus that applies an electrical signal to the semiconductor devices constituting the wafer and determines whether or not the semiconductor devices are defective by a signal checked from the applied electric signal.

The test apparatus is provided with a probe card. The probe card is equipped with probes that come into contact with the electrode pad of the semiconductor device to apply an electrical signal. As a result, the probe card may test the electrical characteristics of the semiconductor devices.

As the semiconductor device is highly integrated, the number of probes mounted on the probe card assembly also increases. As a result, a probe card assembly with increased probe mounting efficiency is required.

SUMMARY OF THE INVENTION

According to an exemplary embodiment of the present inventive concept, a probe card assembly is provided as follows. A tile fixing substrate is disposed on a printed circuit board. A plurality of ceramic tiles is detachably attached to the tile fixing substrate. Each of the plurality of ceramic tiles comprises a plurality of probes. A plurality of alignment marks is fixed to the tile fixing substrate.

According to an exemplary embodiment of the present inventive concept, a probe card assembly is provided as follows. A tile fixing substrate includes a plurality of through-holes. A plurality of alignment marks is fixed to the tile fixing substrate. A plurality of ceramic tiles is disposed on the tile fixing substrate so that each of the plurality of ceramic tiles covers one of the plurality of through-holes. Each of the plurality of ceramic tiles includes a plurality of probes. The plurality of alignment marks is disposed at positions that do not overlap the plurality of ceramic tiles.

According to an exemplary embodiment of the present inventive concept, a probe card assembly is provided as follows. A tile fixing substrate is disposed on a printed circuit board. A plurality of ceramic tiles is detachably attached to the tile fixing substrate. Each of the plurality of ceramic tiles includes a plurality of probes. A plurality of alignment marks is fixed to the tile fixing substrate. The plurality of alignment marks is disposed at positions that do not overlap the plurality of ceramic tiles.

BRIEF DESCRIPTION OF THE DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

Hereinafter, with reference to FIG. 1, a semiconductor test apparatus including a probe card assembly according to an exemplary embodiment of the present inventive concept will be described.

Figure 1:
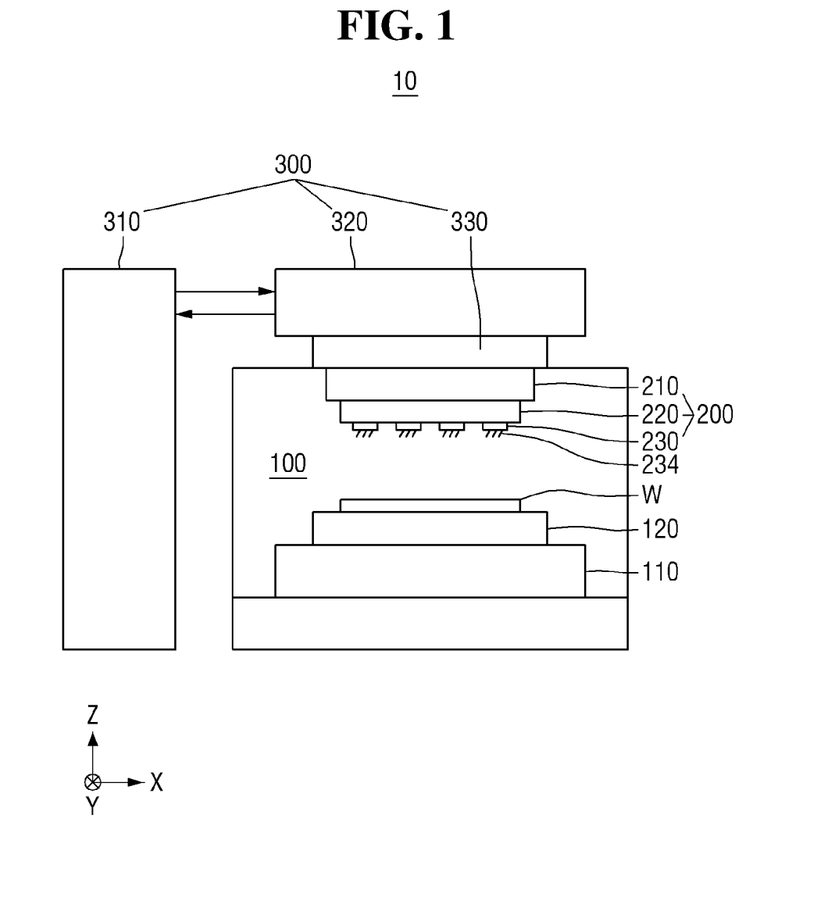
FIG. 1 is a schematic view of a semiconductor test apparatus according to an exemplary embodiment of the present inventive concept.

FIG. 1 is a schematic view of a semiconductor test apparatus according to an exemplary embodiment of the present inventive concept.

Referring to FIG. 1, a semiconductor test apparatus 10 includes a prober chamber 100, a probe card assembly 200, and a tester 300.

An electric die sort (EDS) process may be performed in the prober chamber 100. For example, the prober chamber 100 may provide a space for the EDS process for inspecting the electrical characteristics of the semiconductor device. The prober chamber 100 may provide a space for the EDS process for inspecting the electrical characteristics of the wafer W.

A transport member 110, a chuck 120, and a wafer W may be disposed in the prober chamber 100.

The wafer W may be disposed on the chuck 120. The wafer W may include semiconductor devices to be tested of whether the semiconductor devices are defective. For example, the wafer W may be disposed on the chuck 120 so that the surface of the semiconductor device on which the electrode terminals are formed faces upward.

The chuck 120 may be disposed on the transport member 110. The wafer W may be fixed onto the upper surface of the chuck 120 by a method such as vacuum adsorption.

Although not illustrated, a sandpaper having a predetermined roughness may be disposed on one side surface of the chuck 120. When a foreign object or the like adheres to a tip of at least one of a plurality of probes 234 to be described later, the sandpaper may remove foreign matters and the like by sanding the tip of the plurality of probes 234 with the sandpaper.

The transport member 110 is disposed below the chuck 120 and may linearly move the chuck 120 in horizontal directions X and Y and a vertical direction Z. Also, the transport member 110 may also rotate the chuck 120. Here, the horizontal directions X and Y are the directions in which the semiconductor devices are arranged on the plane of the wafer W, and the vertical direction Z is a direction perpendicular to the plane of the wafer W. As a result, the wafer W fixed to the chuck 120 may linearly move or rotate in the horizontal directions X and Y or the vertical direction Z.

For example, the transport member 110 rotates the chuck 120 so that the arrangement direction of the electrode terminals of the semiconductor device formed on the wafer W may be aligned in the same direction as the arrangement direction of the plurality of probes 234. The transport member 110 moves the chuck 120 in the horizontal directions X and Y so that the electrode terminals of the semiconductor device formed on the wafer W may be aligned below the vertical direction of the plurality of probes 234. The transport member 110 moves the chuck 120 in the vertical direction Z so that the electrode terminals of the semiconductor device formed on the wafer W may physically come into contact the plurality of probes 234.

The probe card assembly 200 includes a printed circuit board 210, a tile fixing substrate 220, and a plurality of ceramic tiles 230. Each ceramic tile 230 may include the plurality of probes 234. The probe card assembly 200 will be described later in detail with reference to FIGS. 2 to 5.

The tester 300 includes a tester main body 310, a tester head 320, and a base unit 330. The probe card assembly 200 may be connected to the base unit 330. For example, the printed circuit board 210 may be connected to the base unit 330. The base unit 330 may include a male connector. A pair of male and female connectors may be disposed on the base unit 330 and the printed circuit board 210, respectively. For example, the printed circuit board 210 may include a female connector receiving and holding the male connector. Therefore, the base unit 330 and the printed circuit board 210 may be coupled to each other.

The tester head 320 may be electrically connected to the probe card assembly 200 connected to the base unit 330. The tester head 320 may be electrically connected to the tester main body 310. The tester head 320 may transmit electrical signals between the probe card assembly 200 and the tester main body 310.

The tester main body 310 may output an electric signal for inspection of the semiconductor device of the wafer W and may receive an electric signal from the semiconductor device to determine an inspection result. Thus, the tester main body 310 may determine whether or not the semiconductor device formed on the wafer W normally operates.

The tester main body 310 may generate an electric signal for an electrical characteristic test of the semiconductor device. Subsequently, the tester head 320 may transmit the electric signal, which is output from the tester main body 310, to the probe card assembly 200. The electric signal transmitted to the probe card assembly 200 may be applied to the semiconductor device via the electrode terminal which is in contact with the plurality of probes 234. Thus, the semiconductor device may perform an operation according to the applied electric signal, and may output the electric signal of the inspection result via the electrode terminal. The electrical signal of the inspection result output from the electrode terminal may be transmitted to the probe card assembly 200 via the plurality of probes 234 which is in contact with the electrode terminal of the semiconductor device. The probe card assembly 200 may transmit the electrical signal of the inspection result to the tester head 320. The tester main body 310 may receive the electric signal of the inspection result from the tester head 320. Thus, the tester 300 may determine whether or not the semiconductor device formed on the wafer W operates normally.

Hereinafter, the probe card assembly according to an exemplary embodiment of the present inventive concept will be described with reference to FIGS. 2 to 5.

Figure 2:
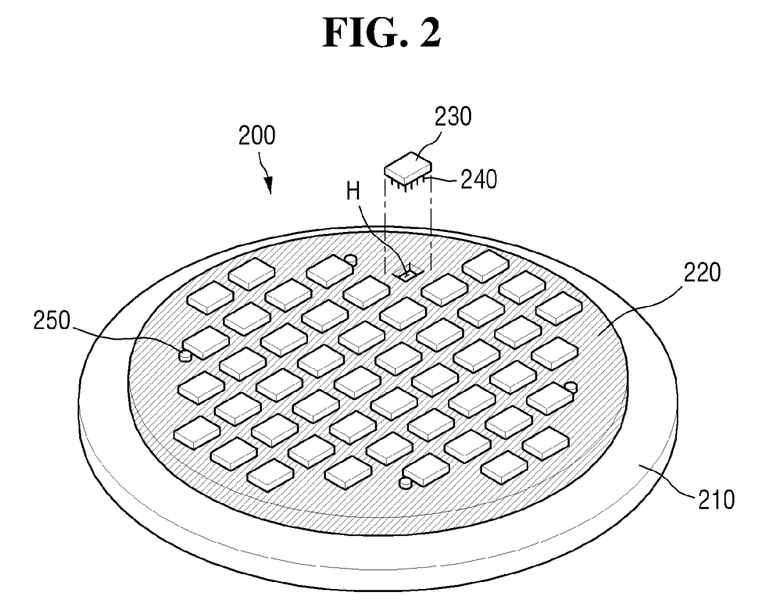
FIG. 2 is a perspective view of a probe card assembly according to an exemplary embodiment of the present inventive concept.
Figure 3:
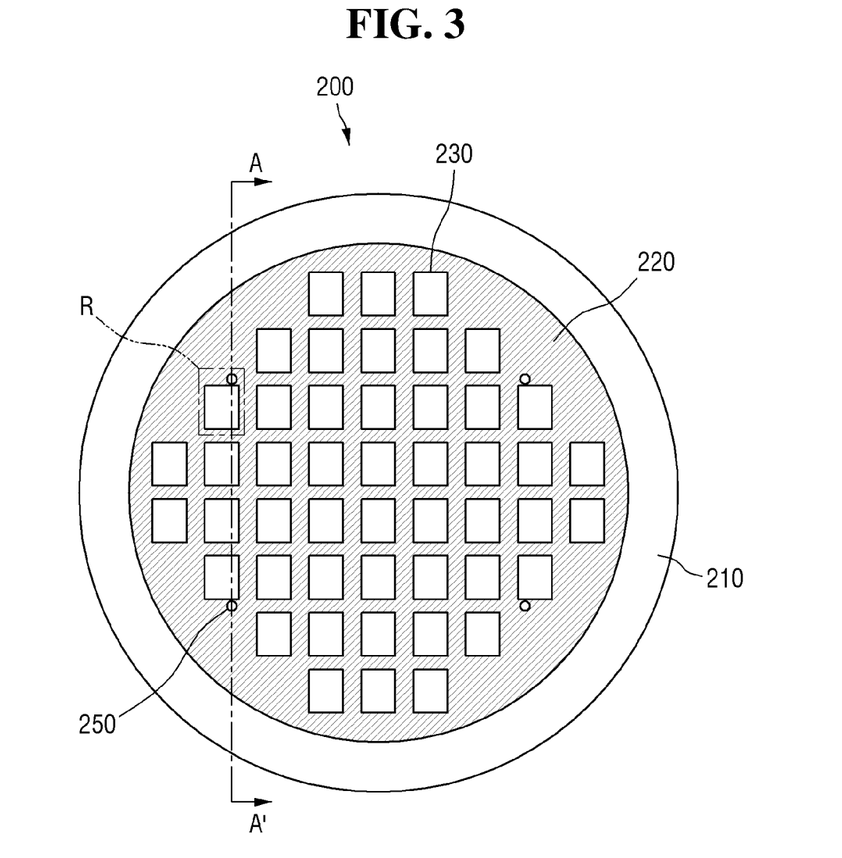
FIG. 3 is a plan view of the probe card assembly of FIG. 2.
Figure 4A:
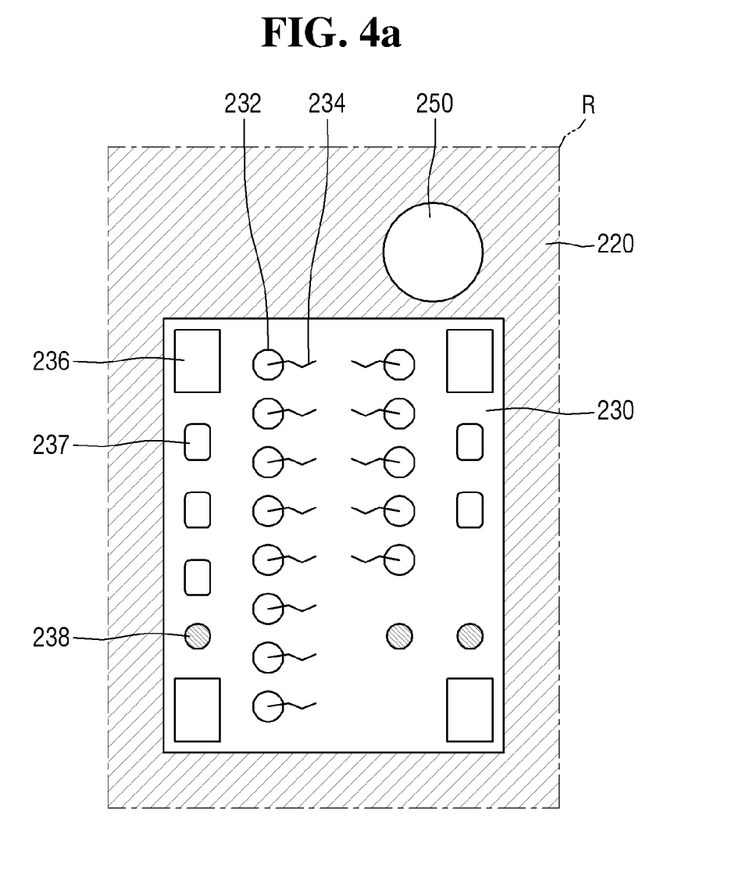
FIG. 4a is an enlarged view of a region R of FIG. 3.
Figure 4B:
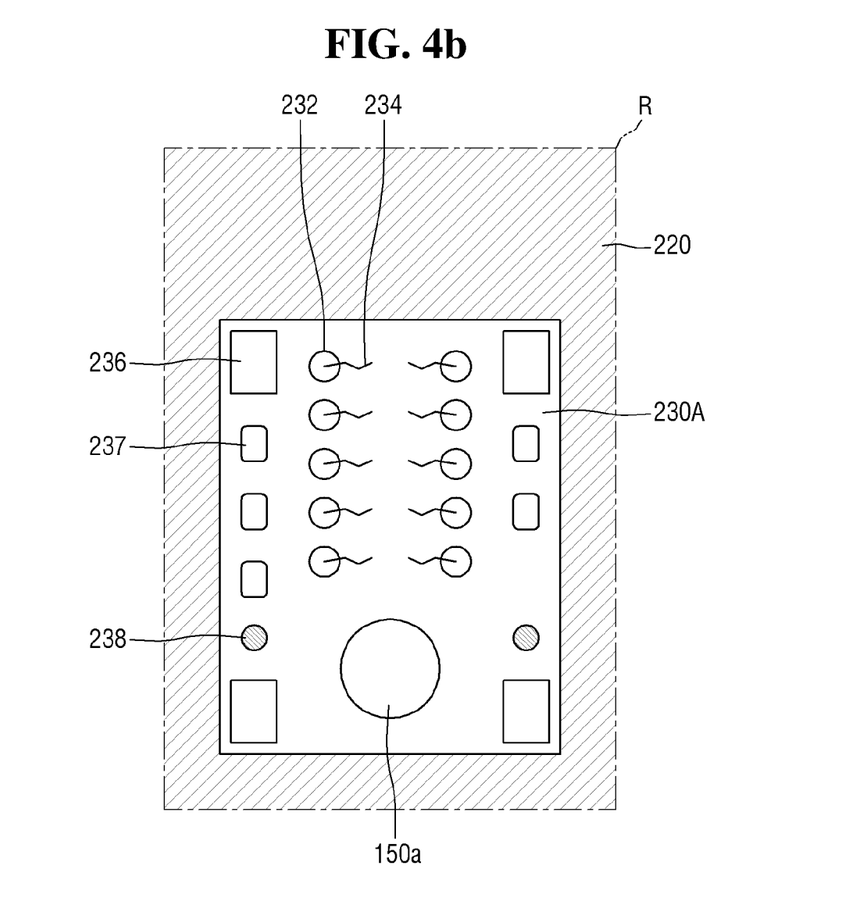
FIG. 4b is a diagram for explaining the effect of the probe card assembly according to an exemplary embodiment of the present inventive concept.
Figure 5:
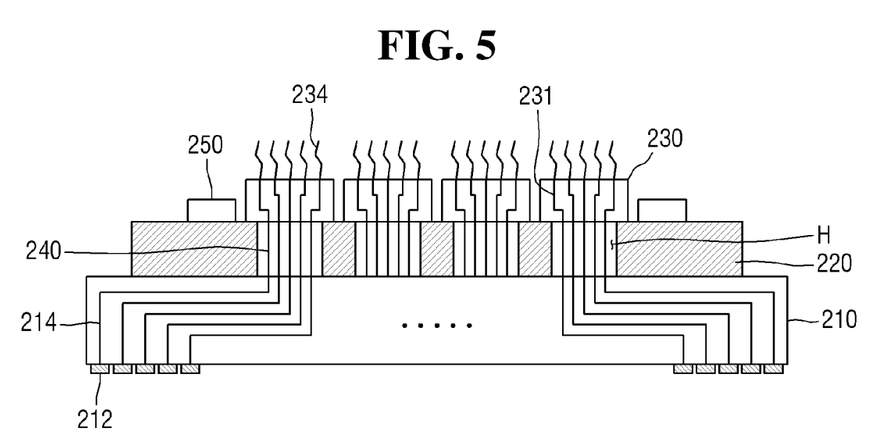
FIG. 5 is a cross-sectional view taken along a line A-A' of FIG. 3.

FIG. 2 is a perspective view of a probe card assembly according to an exemplary embodiment of the present inventive concept. FIG. 3 is a plan view of the probe card assembly of FIG. 2 according to an exemplary embodiment of the present inventive concept. FIG. 4a is an enlarged view of a region R of FIG. 3 according to an exemplary embodiment of the present inventive concept. FIG. 4b is a diagram for explaining the effect of the probe card assembly according to an exemplary embodiment of the present inventive concept. FIG. 5 is a cross-sectional view taken along a line A-A' of FIG. 3 according to an exemplary embodiment of the present inventive concept.

Referring to FIGS. 2 to 5, the probe card assembly 200 includes a printed circuit board 210, a tile fixing substrate 220, a plurality of ceramic tiles 230, a plurality of interposers 240 and a plurality of alignment marks 250.

As described above, the printed circuit board 210 may be coupled to the base unit 330 and electrically connected to the tester head 320. As illustrated in FIG. 5, the printed circuit board 210 may include a plurality of tester contacts 212 and a plurality of first wirings 214.

The plurality of tester contacts 212 may be electrically connected to the tester head 320 of FIG. 1. For example, the electric signal output from the tester main body 310 of FIG. 1 may be transmitted to the plurality of tester contacts 212 via the tester head 320. Further, the electric signal of the inspection result output from the electrode terminal of the semiconductor device formed on the wafer W of FIG. 1 may be transmitted to the tester head 320 via the plurality of tester contacts 212.

The printed circuit board 210 may include the plurality of tester contacts 212. For simplicity of description, each of the plurality of tester contacts 212 has only five tester contacts 212.

The plurality of first wirings 214 may electrically connect the plurality of tester contacts 212 to the plurality of interposers 240. Thus, the plurality of first wirings 214 may provide a signal path for transmitting the electric signal between the printed circuit board 210 and the tester 300.

In FIG. 5, the plurality of first wirings 214 is schematically illustrated. For example, the plurality of first wirings 214 may have physical forms to provide the signal path between the printed circuit board 210 and the tester 300.

The printed circuit board 210 may have a circular shape, but the present inventive concept is not limited thereto.

The tile fixing substrate 220 may be disposed on the printed circuit board 210. The tile fixing substrate 220 may be the substrate used to attach and detach a plurality of ceramic tiles 230 including the plurality of probes 234. For example, a plurality of ceramic tiles 230 including the plurality of probes 234 may be mounted on the tile fixing substrate 220.

As illustrated in FIGS. 2 and 5, the tile fixing substrate 220 may include a plurality of through-holes H. Further, the plurality of through-holes H may be disposed to be adjacent to each other. As a result, a plurality of through-holes H may be densely formed in the tile fixing substrate 220.

For example, when the tile fixing substrate 220 has a circular shape like the printed circuit board 210, the plurality of through-holes H are disposed to be adjacent to each other to draw a circle as a whole. However, the present inventive concept is not limited thereto. For example, the plurality of through-holes H may have various shapes. In an exemplary embodiment, the tile fixing substrate 220 need not include the plurality of through-holes H.

The tile fixing substrate 220 may be formed of a metal, but the present inventive concept is not limited thereto.

The plurality of ceramic tiles 230 may be disposed on the tile fixing substrate 220. The plurality of ceramic tiles 230 may be attached to or detached from the tile fixing substrate 220. For example, the plurality of ceramic tiles 230 may be detachably attached to the tile fixing substrate. Each of the plurality of ceramic tiles 230 may be disposed to correspond to one of the plurality of through-holes H. If the plurality of through-holes H is disposed in a circular form as a whole, the plurality of ceramic tiles 230 may be disposed in a circular form as a whole.

Each of the plurality of ceramic tiles 230 may be larger than each of the plurality of through-holes H in area. For example, each of the plurality of ceramic tiles 230 may overlap the remaining parts of the tile fixing substrate 220 except for the plurality of through-holes H. The remaining parts of the tile fixing substrate 220 may surround each of the plurality of through-holes H. Each of the plurality of ceramic tiles 230 may be fixed onto the remaining parts of the tile fixing substrate 220 except for the plurality of through-holes H, and may be disposed to cover each of the plurality of through-holes H penetrating the tile fixing substrate 220.

As illustrated in FIG. 5, each of the plurality of ceramic tiles 230 may include a plurality of probes 234 and a plurality of second wirings 231. Each of the plurality of ceramic tiles 230 may be a multi-layered ceramic substrate MLC including the plurality of probes 234.

The plurality of probes 234 may be disposed on a top surface of each of the plurality of ceramic tiles 230. The plurality of probes 234 may come into contact with the electrode terminals of the semiconductor device formed on the wafer W of FIG. 1. For example, the electric signal transmitted to the probe card assembly 200 may be applied to the semiconductor device via the plurality of probes 234 that is in contact with the electrical terminals of the semiconductor device of the wafer W of FIG. 1. The electrical signal of the inspection result output from the electrode terminal of the semiconductor device may be transmitted via the plurality of probes 234 to the tester 300 of FIG. 1.

Each of the plurality of ceramic tiles 230 may include the plurality of probes 234. For simplicity of description, each of the plurality of ceramic tiles 230 has a predetermined number of the plurality of probes 234. For example, a number of the plurality of probes 234 is five.

The plurality of second wirings 231 may electrically connect the plurality of probes 234 to the plurality of interposers 240. Therefore, the plurality of second wirings 231 may provide paths for transmitting the electric signals from the plurality of ceramic tiles 230.

In FIG. 5, the plurality of second wirings 231 is schematically illustrated. For example, the plurality of second wirings 231 each may have an arbitrary form among the plurality of physical forms. For example, when each of the plurality of ceramic tiles 230 is a multi-layer ceramic substrate, the plurality of second wirings 231 may be formed by laminating a plurality of ceramic substrates including the conductive wiring.

The plurality of interposers 240 is disposed in the tile fixing substrate 220 and may electrically connect the printed circuit board 210 with the plurality of ceramic tiles 230.

For example, each of the plurality of interposers 240 may be disposed in the tile fixing substrate 220 to correspond to one of a plurality of through-holes H. For example, the plurality of interposers 240 is interposed between the printed circuit board 210 and the plurality of ceramic tiles 230 and may be disposed in the plurality of through-holes H of the tile fixing substrate 220. For example, the plurality of interposers 240 penetrates the tile fixing substrate 220 through the plurality of through-holes H so that the plurality of interposers 240 is connected to the first wiring 214.

As described above, each of the plurality of interposers 240 may be electrically connected to one of the plurality of first wirings 214 of the printed circuit board 210. Each of the plurality of interposers 240 may be electrically connected to one of the plurality of second wirings 231 disposed in the plurality of ceramic tiles 230. As a result, one of the plurality of first wirings 214, one of the plurality of interposers 240, and one of the plurality of second wirings 231 may be electrically connected in series to provide a path for transmitting the electric signal in the probe card assembly 200.

The plurality of alignment marks 250 may be fixed to the tile fixing substrate 220. The plurality of alignment marks 250 may be disposed and fixed on the tile fixing substrate 220.

To inspect the electrical characteristics of the semiconductor device, the plurality of probes 234 need to be accurately aligned to come into contact with the electrode terminals of the semiconductor device. The examination of the electrical characteristics of the semiconductor device with a high degree of integration demands such accurate alignment of the plurality of probes 234 with the semiconductor device.

Thus, in the EDS process, with the plurality of alignment marks 250 formed on the probe card assembly 200, the plurality of probes 234 may be accurately aligned to the electrode terminals of the semiconductor device formed on the wafer W of FIG. 1. For example, the EDS process may use the plurality of alignment marks 250 in the macro alignment. In the macro alignment of the EDS process, the plurality of alignment marks 250 may be recognized to make the center of the probe card assembly 200 match the center of the wafer W. For example, the plurality of alignment marks 250 may serve as a reference mark in the macro alignment.

The plurality of alignment marks 250 may be disposed at a position that does not overlap the plurality of ceramic tiles 230. For example, the plurality of alignment marks 250 may be disposed on the tile fixing substrate 220 similarly to the plurality of ceramic tiles 230 without overlapping the plurality of ceramic tiles 230. For example, the plurality of alignment marks 250 need not be disposed on the ceramic tile 230.

As described above in the description of FIGS. 2 and 3, the plurality of ceramic tiles 230 may be disposed on the tile fixing substrate 220 to be adjacent to each other. At this time, each of the plurality of alignment marks 250 may be adjacent to one of the plurality of ceramic tiles 230 disposed on the outermost side.

For example, each of the plurality of alignment marks 250 may be fixed onto the edge of the tile fixing substrate 220. As illustrated in FIGS. 2 to 4a, when the plurality of ceramic tiles 230 draws a circular shape as a whole, the plurality of alignment marks 250 may be fixed to the edge of the tile fixing substrate 220 in adjacent to the circular edge. For example, each of the plurality of alignment marks 250 may be disposed to be adjacent to one of the plurality of ceramic tiles 230 disposed on the outermost side among the plurality of ceramic tiles 230 forming the circular shape.

In an exemplary embodiment, the plurality of ceramic tiles 230 may be arranged in a predetermined shape as a whole. For example, the predetermined shape may include a circular shape.

In an exemplary embodiment, a number of the plurality of alignment marks 250 may be three or more. The plurality of alignment marks 250 may be symmetrically disposed. For example, as illustrated in FIGS. 2 and 3, the number of the plurality of alignment marks 250 is four, and the plurality of alignment marks 250 may be symmetrically disposed on the tile fixing substrate 220.

The plurality of alignment marks 250 may accurately position in the probe card assembly 200 on a horizontal plane. For example, the electrode terminals of the semiconductor device formed on the wafer W may be precisely aligned below the vertical direction of the probe 234, using the plurality of alignment marks 250.

In an exemplary embodiment, the plurality of alignment marks 250 may have a cylindrical shape. For example, as illustrated in FIG. 3, the plurality of alignment marks 250 each may have a circular shape in the top view. However, the present inventive concept is not limited thereto. For example, the plurality of alignment marks 250 may have various shapes to be recognized for alignment in the semiconductor test apparatus 10. For example, in the top view, the plurality of alignment marks 250 each may also have a cross shape.

In an exemplary embodiment, the plurality of alignment marks 250 may contain a metal. However, the present inventive concept is not limited thereto. For example, the plurality of alignment marks 250 may contain various substances that may cause a contrast difference for alignment. For example, the plurality of alignment marks 250 may contain a ceramic material.

Hereinafter, the ceramic tile of the probe card assembly according to an exemplary embodiment of the present inventive concept will be specifically described. FIG. 4a is an enlarged view of a region R of FIG. 3.

As illustrated in FIG. 4a, each of the plurality of ceramic tiles 230 may further include a plurality of probe pads 232 and a plurality of fixing parts 236.

The plurality of probe pads 232 each may be an electrode terminal of the ceramic tile 230 on which one of the plurality of probes 234 is disposed. For example, the plurality of probes 234 each may be mounted on one of the plurality of probe pads 232. For example, the plurality of probes 234 each may protrude from an upper surface of one of the plurality of probe pads 232.

Further, the plurality of probe pads 232 may be electrically connected to the printed circuit board 210. For example, the plurality of probe pads 232 each may be electrically connected to one of the plurality of second wirings 231 and may be electrically connected to the printed circuit board 210. For example, the plurality of probe pads 232 may electrically connect the printed circuit board 210 and the plurality of probes 234.

The plurality of fixing parts 236 may be disposed to be spaced part from the plurality of probe pads 232 on the ceramic tile 230.

Also, the plurality of fixing parts 236 may connect one of the plurality of ceramic tiles 230 to the tile fixing substrate 220. As described above with reference to FIGS. 2 and 5, each of the plurality of ceramic tiles 230 may overlap the remaining portions of the tile fixing substrate 220 except for the plurality of through-holes H. At this time, the plurality of fixing parts 236 may be disposed on one of the plurality of ceramic tiles 230 overlapping the tile fixing substrate 220 and may connect the one of the plurality of ceramic tiles 230 to the tile fixing substrate 220.

For example, the plurality of fixing parts 236 may be disposed at the edge of the one of the plurality of ceramic tiles 230 to connect the one of the plurality of ceramic tiles 230 to the tile fixing substrate 220. For example, as illustrated in FIG. 4a, the plurality of fixing parts 236 may be disposed on the four corners of the one of the plurality of ceramic tiles 230.

The plurality of fixing parts 236 may extend in the direction from the lower surface of the ceramic tile 230 toward the upper surface of the one of the plurality of ceramic tiles 230 through the one of the plurality of ceramic tiles 230. For example, the plurality of fixing parts 236 each may penetrate the one of the plurality of ceramic tiles 230. The lower surface of the fixing part 236 may be connected to the tile fixing substrate 220 by soldering, for example. The present inventive concept is not limited thereto.

Further, the plurality of ceramic tiles 230 each may further include electronic elements 237 and 238 that are disposed to be spaced apart from the plurality of probe pads 232.

For example, the electronic elements 237 and 238 may include a resistor, a capacitor, an inductor, a diode, a transistor, a driver circuit, an integrated circuit (e.g., a driver circuit, a digital processor, a digital memory, a digital logic circuit, an analog circuit integrated in semiconductor material, or combinations thereof), or a combination thereof. For example, the electronic elements 237 and 238 may include a protection resistor or a decoupling capacitor to protect a semiconductor device from voltage spikes. The present inventive concept, however, is not limited thereto.

Hereinafter, the effect of the probe card assembly according to an exemplary embodiment of the present inventive concept will be described with reference to FIGS. 4a and 4b.

In FIG. 4b as a comparative example of the present inventive concept, a ceramic tile 230A may include a plurality of fixing parts 236 for fixing the ceramic tile 230A, and an alignment mark 150a for aligning a plurality of probes 234.

The plurality of fixing parts 236 and the alignment mark 150a disposed on the ceramic tile 230A reduce the space for disposing the plurality of probe pads 232 and electronic elements 237 and 238. As such, the efficiency of mounting the plurality of probes 234 on the ceramic tile 230A may reduce. For example, the alignment mark 150a may be in plural, for example, three or more, to align the plurality of probes 234. However, due to problems such as manufacturing cost, the alignment mark 150a may be formed on the ceramic tile 230A. This may consequently lower the mounting efficiency of the plurality of probes 234 in the ceramic tile 230A.

In the probe card assembly 200 according to an exemplary embodiment of the present inventive concept, an alignment mark is formed at a position where the alignment mark does not overlap a plurality of ceramic tiles, and the mounting efficiency of the probe in the respective ceramic tiles may be improved. For example, the alignment mark may non-overlapped with the plurality of ceramic tiles.

As described above in the description of FIG. 4a, the plurality of alignment marks 250 of the probe card assembly 200 according to an exemplary embodiment of the present inventive concept may be disposed at a position where the plurality of alignment marks 250 does not overlap the plurality of ceramic tiles 230.

Therefore, the probe card assembly 200 according to an exemplary embodiment of the present inventive concept may secure a space for disposing the plurality of probe pads 232 and electronic elements 237 and 238 on each of the plurality of ceramic tiles 230, without causing an additional manufacturing cost. As a result, the efficiency of mounting the plurality of probes 234 on each of the plurality of ceramic tiles 230.

Figure 6:
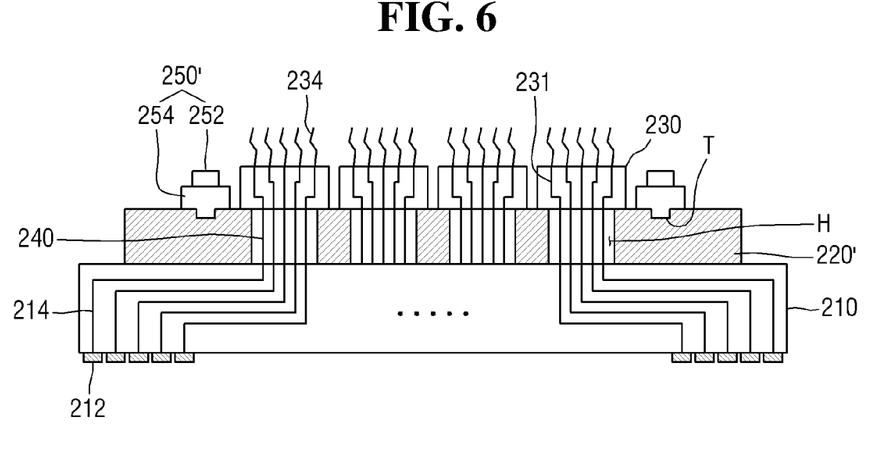
FIG. 6 is a cross-sectional view of a probe card assembly according to an exemplary embodiment of the present inventive concept.

Hereinafter, the probe card assembly according to an exemplary embodiment of the present inventive concept will be described with reference to FIG. 6. The probe card assembly of FIG. 6 is substantially the same as the probe card assembly described with reference to FIGS. 1 to 5, except for the alignment mark and the tile fixing substrate. Therefore, the differences will be mainly described.

FIG. 6 is a cross-sectional view of a probe card assembly according to an exemplary embodiment of the present inventive concept.

Referring to FIG. 6, the probe card assembly according to the present embodiment may include an alignment mark 250'. The alignment mark 250' may include an alignment auxiliary substrate 254 and an alignment key 252.

The alignment auxiliary substrate 254 may be disposed on the tile fixing substrate 220'. For example, the alignment auxiliary substrate 254 may be fixed to the top of the tile fixing substrate 220', and may specify the accurate position of the alignment key 252.

The tile fixing substrate 220' may include a trench T. The trench T may be a groove formed by etching a part of the upper surface of the tile fixing substrate 220'. The alignment mark 250' may be formed in the trench T. For example, the trench T may be disposed at a position that does not overlap the plurality of ceramic tiles 230. A part of the alignment auxiliary substrate 254 may be buried in the trench T so that the alignment auxiliary substrate 254 may be fixed to the top of the tile fixing substrate 220'. The present inventive concept, however, is not limited thereto. For example, unlike FIG. 6, the alignment auxiliary substrate 254 may be disposed on a tile fixing substrate without having a trench.

In an exemplary embodiment, the alignment auxiliary substrate 254 may include a material having a color that is darker than a color of the tile fixing substrate 220'. For example, the tile fixing substrate 220' may contain a metal having a silver white color, and the alignment auxiliary substrate 254 may contain a ceramic having a black color. As a result, the alignment auxiliary substrate 254 may prevent an alignment error due to the reflection of light in the process of aligning the plurality of probes 234 with the electrode terminal of the semiconductor device formed on the wafer W of FIG. 1.

The alignment key 252 may be disposed on the alignment auxiliary substrate 254. The alignment key 252 may be a configuration of an alignment mark 250' which is recognized in the process of aligning the plurality of probes 234 with the electrode terminal of the semiconductor device formed on the wafer W of FIG. 1. In an exemplary embodiment, the alignment key 252 may have various shapes to be identified as an alignment mark in the process of aligning the plurality of probes 234 with the semiconductor device of the wafer W in FIG. 1.

The alignment key 252 may have a cylindrical shape. For example, the alignment key 252 may have a circular shape in the top view. The present inventive concept, however, is not limited thereto. For example, the alignment key 252 may have various shapes that may be recognized. For example, the alignment key 252 may also have a cross shape in the top view.

The alignment key 252 may contain metal. However, the present inventive concept, however, is not limited thereto. For example, the alignment key 252 may contain various materials that may cause a contrast difference. For example, the alignment key 252 may contain ceramic.

Thus, the probe card assembly according to an exemplary embodiment of the present inventive concept may increase the probe mounting efficiency by forming alignment marks at positions that do not overlap a plurality of ceramic tiles. Further, the probe card assembly according to an exemplary embodiment of the present inventive concept may accurately specify an alignment key, prevent the arrangement errors, and provide a probe card assembly with increased performance.

Figure 7:
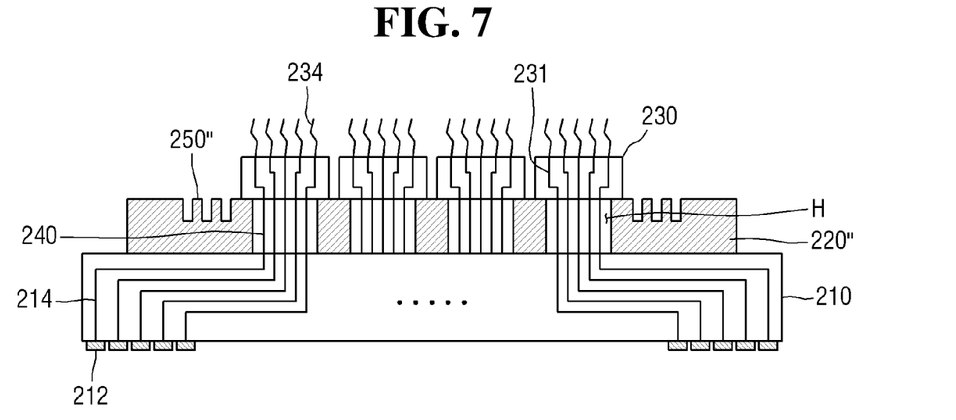
FIG. 7 is a cross-sectional view of a probe card assembly according to an exemplary embodiment of the present inventive concept.

Hereinafter, a probe card assembly according to an exemplary embodiment of the present inventive concept will be described with reference to FIG. 7. The probe card assembly of FIG. 7 is substantially the same as the probe card assembly described with reference to FIGS. 1 to 5, except for the alignment mark and the tile fixing substrate. Therefore, the differences will be mainly described.

FIG. 7 is a cross-sectional view of a probe card assembly according to an exemplary embodiment of the present inventive concept.

Unlike FIG. 4b where alignment marks are formed on a ceramic tile, a plurality of alignment marks may be formed on a tile fixing substrate. For example, referring to FIG. 7, the probe card assembly may include a tile fixing substrate 220" and an alignment mark 250".

In FIG. 7, the tile fixing substrate 220" may be partially patterned to form the alignment mark 250". For example, the alignment mark 250" may be formed by patterning a part of the tile fixing substrate 220" which does not overlap a plurality of ceramic tiles 230.

Thus, the efficiency of mounting of the plurality of probes 234 may be increased by forming the alignment mark 250" at a position which does not overlap the plurality of ceramic tiles 230. Further, the probe card assembly according to an exemplary embodiment of the present inventive concept may form an alignment mark by various methods.

Figure 8:
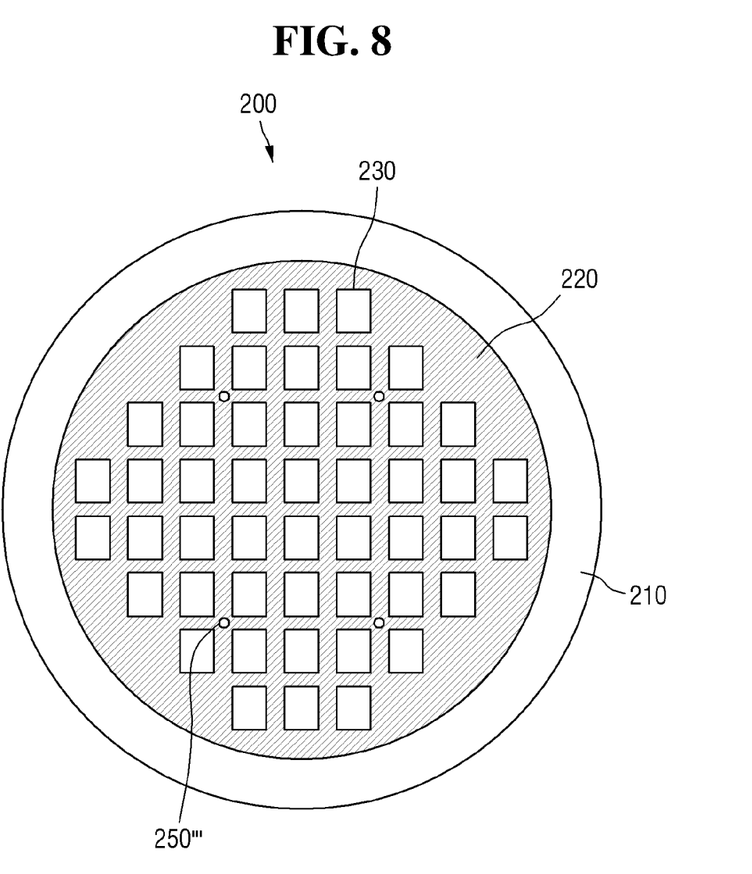
FIG. 8 is a plan view of a probe card assembly according to an exemplary embodiment of the present inventive concept.

Hereinafter, the probe card assembly according to an exemplary embodiment of the present inventive concept will be described with reference to FIG. 8. The probe card assembly of FIG. 8 is substantially the same as the probe card assembly described with reference to FIGS. 1 to 5, except for the position at which an alignment mark is disposed. Therefore, the differences will be mainly explained.

FIG. 8 is a plan view of a probe card assembly according to an exemplary embodiment of the present inventive concept.

Unlike FIG. 4b where the alignment mark 150a is formed on the ceramic tile 230, a plurality of alignment marks 250''' may be formed on a tile fixing substrate 220. For example, referring to FIG. 8, the probe card assembly according to the present embodiment includes the plurality of alignment mark 250'''.

Unlike the plurality of alignment marks 250 of FIG. 3, a plurality of alignment marks 250''' need not be fixed on the edge of the tile fixing substrate 220. For example, the plurality of alignment marks 250′′′ may be fixed to the top of the tile fixing substrate 220 in an arbitrary region that does not overlap a plurality of ceramic tiles 230.

Thus, in the probe card assembly of FIG. 8, the efficiency of mounting the probe may be increased by forming the alignment mark 250′′′ at a position that does not overlap the plurality of ceramic tiles 230. Further, the probe card assembly according to the present embodiment may be fixed at various positions as necessary, corresponding to various arrangements of the semiconductor devices formed on a wafer to be tested.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A probe card assembly comprising:
   a printed circuit board;
   a tile fixing substrate disposed on the printed circuit board;
   a plurality of ceramic tiles detachably attached to the tile fixing substrate, each of the plurality of ceramic tiles comprising a plurality of probes; and
   a plurality of alignment marks fixed to the tile fixing substrate, wherein each alignment mark of the plurality of alignment marks is spaced apart from a probe of the plurality of probes,
   wherein each of the plurality of alignment marks comprises:
      an alignment auxiliary substrate disposed on the tile fixing substrate; and
      an alignment key disposed on the alignment auxiliary substrate.

2. The probe card assembly of claim 1, further comprising:
   a plurality of interposers disposed inside the tile fixing substrate to electrically connect the printed circuit board and the plurality of ceramic tiles.

3. The probe card assembly of claim 2,
   wherein the tile fixing substrate comprises a plurality of through-holes,
   wherein each of the plurality of ceramic tiles is disposed on the tile fixing substrate to cover one of the plurality of through-holes, and
   wherein the plurality of interposers is disposed inside the plurality of through-holes of the tile fixing substrate.

4. The probe card assembly of claim 1,
   wherein the plurality of alignment marks is disposed on the tile fixing substrate, and
   wherein the plurality of alignment marks is non-overlapped with the plurality of ceramic tiles.

5. The probe card assembly of claim 1,
   wherein the plurality of ceramic tiles is disposed on the tile fixing substrate to form a predetermined shape, and
   wherein each of the plurality of alignment marks is adjacent to one of the plurality of ceramic tiles disposed on an outermost side of the predetermined shape.

6. The probe card assembly of claim 1,
   wherein a number of the plurality of alignment marks is three or more.

7. The probe card assembly of claim 6,
   wherein the plurality of alignment marks is disposed symmetrically.

8. The probe card assembly of claim 1,
   wherein the alignment auxiliary substrate has a color darker than a color of the tile fixing substrate.

9. The probe card assembly of claim 1,
   wherein each of the plurality of ceramic tiles further comprises:
      a probe pad electrically connected to the printed circuit board, wherein the plurality of probes is disposed on the probe pad; and
      a fixing part disposed to be spaced apart from the probe pad to attach each of the plurality of ceramic tiles to the tile fixing substrate.

10. The probe card assembly of claim 9,
    wherein each of the plurality of ceramic tiles further comprises at least one of a protection resistor and a decoupling capacitor disposed to be spaced apart from the probe pad.

11. A probe card assembly comprising:
    a tile fixing substrate comprising a plurality of through-holes;
    a plurality of alignment marks fixed to the tile fixing substrate; and
    a plurality of ceramic tiles disposed on the tile fixing substrate so that each of the plurality of ceramic tiles covers one of the plurality of through-holes,
    wherein each of the plurality of ceramic tiles comprises a plurality of probes,
    wherein the plurality of alignment marks is disposed outside of each of the plurality of ceramic tiles and at positions that do not overlap the plurality of ceramic tiles in a plan view, and
    wherein each of the plurality of alignment marks comprises:
       an alignment auxiliary substrate disposed on the tile fixing substrate; and
       an alignment key disposed on the alignment auxiliary substrate.

12. The probe card assembly of claim 11,
    wherein the plurality of ceramic tiles is disposed on the tile fixing substrate to form a predetermined shape, and
    wherein each of the plurality of alignment marks is adjacent to an outermost side of the predetermined shape.

13. The probe card assembly of claim 11,
    wherein a number of the plurality of alignment marks is three or more.

14. A probe card assembly comprising:
    a printed circuit board;
    a tile fixing substrate disposed on the printed circuit board;
    a plurality of ceramic tiles detachably attached to the tile fixing substrate, wherein each of the plurality of ceramic tiles includes a plurality of probes; and
    a plurality of alignment marks fixed to the tile fixing substrate,
    wherein the plurality of alignment marks is disposed outside of each of the plurality of ceramic tiles and at positions that do not overlap the plurality of ceramic tiles in a plan view, and
    wherein each of the plurality of alignment marks comprises:
       an alignment auxiliary substrate disposed on the tile fixing substrate; and
       an alignment key disposed on the alignment auxiliary substrate.

15. The probe card assembly of claim 14,
wherein the tile fixing substrate includes a trench, and
wherein the plurality of alignment marks is disposed in the trench.

16. The probe card assembly of claim 14, further comprising:
a plurality of interposers electrically connecting the printed circuit board to the plurality of ceramic tiles,
wherein the tile fixing substrate comprises a plurality of through-holes,
wherein each of the plurality of ceramic tiles is disposed on the tile fixing substrate to cover one of the plurality of through-holes, and
wherein the plurality of interposers is disposed inside the plurality of through-holes of the tile fixing substrate.

17. The probe card assembly of claim 14, wherein each of the plurality of ceramic tiles further comprises:
a probe pad electrically connected to the printed circuit board, wherein the plurality of probes is disposed on the probe pad; and
a fixing part disposed to be spaced apart from the probe pad to attach each of the plurality of ceramic tiles to the tile fixing substrate.

\* \* \* \* \*